United States Patent [19]

Wolber et al.

[11] 4,270,834

[45] Jun. 2, 1981

[54] ELECTRIC CONTACT FOR A BATTERY-OPERATED INSTRUMENT

[75] Inventors: Robert Wolber; Roland Maurer, both of Lauterbach, Fed. Rep. of Germany

[73] Assignee: Gebruder Junghans GmbH, Schramberg, Fed. Rep. of Germany

[21] Appl. No.: 68,590

[22] Filed: Aug. 22, 1979

[30] Foreign Application Priority Data

Sep. 12, 1978 [DE] Fed. Rep. of Germany ... 7827030[U]

[51] Int. Cl.³ ...................... G04C 10/00; H01R 13/50; H05K 1/11

[52] U.S. Cl. ................................ 339/147 R; 339/152; 368/204

[58] Field of Search ......................... 368/87, 203, 204; 339/147 R, 152, 170; 320/3

[56] References Cited

U.S. PATENT DOCUMENTS

| | | | |
|---|---|---|---|
| Re. 29,551 | 2/1978 | Zurcher et al. | 368/87 X |
| 3,911,663 | 10/1975 | Kern et al. | 368/204 |
| 3,968,417 | 7/1976 | Dials | 368/204 X |
| 4,083,011 | 4/1978 | Ferrell et al. | 339/152 |

*Primary Examiner*—Eugene F. Desmond
*Attorney, Agent, or Firm*—Burns, Doane, Swecker & Mathis

[57] ABSTRACT

An electrical contact arrangement is disclosed for a battery-operated instrument, especially a battery-operated clock having a housing made of synthetic material such as plastic. Two contact elements are provided for connecting two terminals of the battery with two respective paths of a circuit board. One of the contact elements comprises a bus fastened to the plastic housing, and several legs. A first leg makes contact with one terminal of the battery and the second leg makes contact with a path of the circuit board. The second leg is designed in the form of a knife-edge contact with a first portion bearing against a wall of the housing and a second portion bearing against the circuit board, the latter having been inserted into the housing parallel with such wall. The second portion of the contact engages an appropriate path of the board.

9 Claims, 5 Drawing Figures

FIG. 1
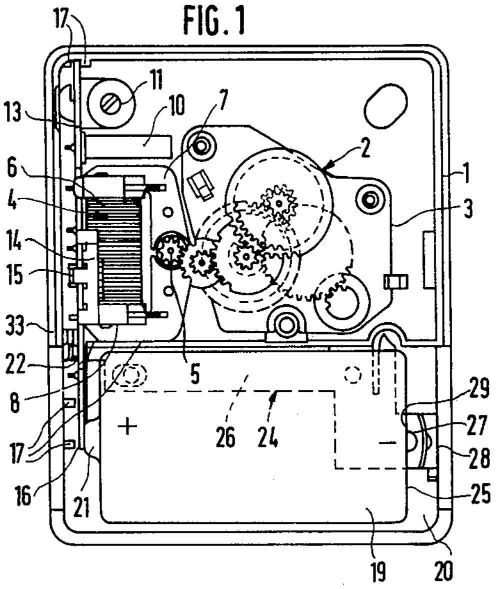
FIG. 2
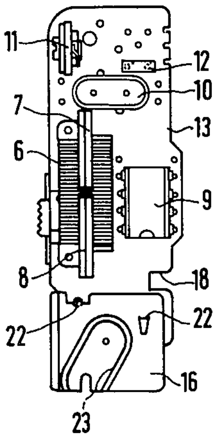
FIG. 3
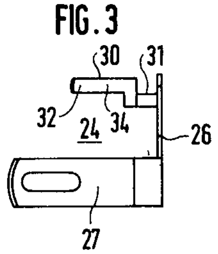
FIG. 4
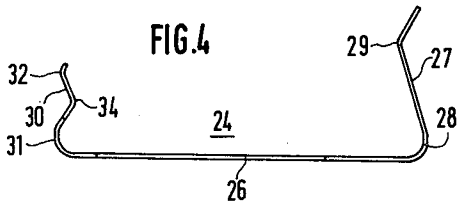
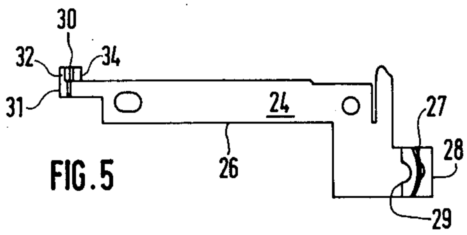
FIG. 5

ELECTRIC CONTACT FOR A BATTERY-OPERATED INSTRUMENT

RELATED APPLICATIONS

The related disclosures of the following copending U.S. applications, filed simultaneously herewith, are incorporated herein by reference as if set forth at length:

1. U.S. Application Ser. No. 68,591 by Robert Wolber et al (corresponding to German Application No. G 78 27 035.6 filed Sept. 12, 1978).
2. U.S. Application Ser. No. 68,620 by Robert Wolber et al (corresponding to German Application No. G 78 27 031.2 filed Sept. 12, 1978).
3. U.S. Application Ser. No. 68,619 by Hans Flaig et al (corresponding to German Application No. P 28 39 611.4-34 filed Sept. 12, 1978).
4. U.S. Application Ser. No. 68,598 by Roland Maurer (corresponding to German Application No. G 78 27 034.5 filed Sept. 12, 1978).
5. U.S. Application Ser. No. 68,597 by Udo Schultheiss (corresponding to German Application No. G 78 27 033.4 filed Sept. 12, 1978).
6. U.S. Application Ser. No. 68,595 by Friedrich Assmus (corresponding to German Application No. P 28 39 554.2-31 filed Sept. 12, 1978).
7. U.S. Application Ser. No. 68,596 by Robert Wolber et al (corresponding to German Application No. P 28 39 555.3-31 filed Sept. 12, 1978).

BACKGROUND AND OBJECTS OF THE INVENTION

The present invention concerns an electric contact for a battery-powered instrument.

A battery contact is known from registered German Gebrauchsmuster No. 73 27 047. The legs of the contact elements shown by this patent extend across a circuit board (which is connected to other parts by means of separate fastening elements) from the direction of its narrow side and engage with their outer ends the appropriate electric paths of the board under spring action. In the case of a defect requiring the replacement of the circuit board, it becomes necessary in the case of this known arrangement to detach first the two contact elements from their mountings and then to loosen the fastening element which holds the circuit board in place.

It is, therefore, an object of the present invention to provide a contact arrangement which will permit a simple assembly or disassembly of a circuit board and at the same time mechanically lock the circuit board within the housing of the instrument.

BRIEF SUMMARY OF THE INVENTION

These objects are achieved by providing a battery contact element comprising a bus portion which can be fastened to an instrument housing and a pair of legs projecting from the bus portion. A first leg contacts one terminal of the battery and an electric path on a circuit board. The second leg is in the form of a knife-edge contact and includes a first portion bearing against a wall of the housing and a second portion bearing against an electric path of the circuit board. The special arrangement of the circuit board within the housing of the instrument as well as the design of the second leg of the contact element in the form of a knife-edge contact makes it possible to insert into, or remove from, the housing a circuit board by practically one single manual operation. Since the leg also exerts a force against the circuit board, the board will be pressed against guide ribs which function as its lateral control, with the result that the board is held in its installed position without the need for additional fastening elements.

THE DRAWING

A preferred embodiment of the novel arrangement of the clock will now be described in detail with reference to the drawing wherein:

FIG. 1 is a rear view of a clock, with its rear section removed,

FIG. 2 shows one side of a circuit board, visible inside the FIG. 1 view of the clock, as well as several components mounted on this board, FIG. 3 is a side view of a contact element according to the invention, FIG. 4 is a front view of the contact element, and FIG. 5 is a top view of the contact element.

DETAILED DESCRIPTION OF A PREFERRED EMBODIMENT OF THE INVENTION

A clock, illustrated in the drawing as an example of a battery-operated instrument, in which the present invention may be utilized, has a housing which is formed by a front section 1 and a rear section (not illustrated). Both sections of the housing are made of synthetic material and are connected with each other by means of the usual locking projections and recesses which are formed on these sections. Numeral 2 denotes a clock and driving clockwork, the component parts of which are mounted on suitable bearings and arranged within the area between the bottom of the front section 1 of the housing and a dividing plate 3 as well as within the area between this plate and the bottom of the rear section of the housing. A stepping motor 4 is provided for the drive of the clockwork 2. The motor includes a rotor 5 carrying a pinion which engages the teeth of a first wheel of the clockwork. The rotor 5 is supported in axially aligned mounts of the two housing sections. The static components of the stepping motor 4, namely a coil 6 and two stacks of stator laminations 7, 8 as well as the elements of an electronic circuitry, namely an integrated circuit 9, a quartz resonator 10, a trimmer capacitor 11 and a fixed capacitor 12, are fastened to a circuit board 13 (see especially FIG. 2). Also fastened to the circuit board 13 is a slide switch 14 which moves along one edge of the board. The switch includes a spring contact 15 which is adapted to contact two electric paths of the circuit board the purpose of creating the electric pulse feed connection from the integrated circuit 9 to the coil 6 of the stepping motor 4. By sliding the switch, such connection can be broken.

Also arranged on the circuit board 13 is a contact plate 16 which forms a portion of a battery contact arrangement. The above-named components 6 to 12, 14 and 16 form, in conjunction with the circuit board 13, an insertable module that can be assembled externally, and pushed by means of a single manual operation into the casing section 1 to be retained therein by suitably designed retaining elements on the housing. The retaining elements comprise supporting ribs 17 which restrain the circuit board 13 against lateral movement. Some of the supporting ribs 17 (upper ribs) are located on a top wall of the housing and receive therebetween and edge of the circuit board while others of the ribs 17 (lower ribs) are located on a side wall 33 of the housing in the vicinity of the battery area to bear against a printed surface of the board. The inserted circuit board is secured in the longitudinal direction by a transversal rib (not illustrated) at the bottom of the housing section 1 which engages a correspondingly molded locking groove 18 (see FIG. 2) of the circuit board.

The clock is supplied with current by a battery 19 which is inserted into a recess 20 of the housing section 1.

A first, previously mentioned, contact element 16 is designed as a battery contact plate with the function to connect the positive terminal 21 of the battery 19 with the appropriate paths of the circuit board 13. This contact plate 16 is designed in the form of a punched-out, flexible metal part and is soldered to the appropriate paths by angled lugs 22 which pass through bores of the circuit board. This contact element 16 is further provided with a groove 23 (FIG. 2) which is inclined toward the bottom of the housing section 1 and which receives the protruding positive terminal 21 of the battery 19. This specific design of the groove 23 is used in order to minimize any necessary alterations in case of the use of a smaller battery, for example a "mignon" cell in place of the "baby" cell illustrated here because only the battery area 20 and a second contact element 24 would require slight adjustments while the lay-out of the clock can remain unchanged in other respects.

The above-mentioned second contact element 24 connects the negative terminal 25 of the battery 19 with the appropriate electrical path of the circuit board 13. This contact element 24, illustrated in detail in FIGS. 3 to 5, is designed in the form of a punched-out, flexible metal part and comprises a flat bus 26 fastened to the bottom of the casing section 1, and several legs jutting out from it. An S-shaped first leg 27 includes one portion 28 which abuts against a wall of the front section 1 of the casing while its other portion 29 contacts the negative terminal 25 of the battery 19.

A second leg 30, again bent in S-shape, is also formed on the bus 26. In accordance with the present invention, this second leg 30 is designed in the shape of a knife-edge contact for the purpose and function of not only contacting electrically the circuit board 13 (once inserted into the housing) but also to hold the circuit board in its inserted position by mechanical force. For this purpose, this S-shaped leg 30 includes sections 31 and 32 which bear against a wall 33 of the front section 1 of the housing. Another portion 34 of the leg 30 bears against the circuit board 13, after the latter has been inserted into the housing parallel with the wall 33. Specifically, the portion 34 contacts with a widened contact surface the appropriate path which is provided within this region.

The portion 34 bears initially under compression adjacent the frontal area of the supporting ribs 17 which border the battery area. This portion 34 of the leg 30 will be deflected toward the wall 33 during insertion of the circuit board 13 into the housing. A force component between wall 33 and the circuit board 13 is thereby generated, pressing the latter against upper ones of the supporting ribs 17. The circuit board 13 is thus frictionally held within the housing without the use of any additional fastening means.

Although the invention has been described in connection with a preferred embodiment thereof, it will be appreciated by those skilled in the art that additions, modifications, substitutions and deletions not specifically described may be made without departing from the spirit and scope of the invention as defined in the appended claims.

What is claimed is:

1. A contact arrangement for a battery-operated instrument of the type comprising a plastic housing having a battery-receiving recess and a first support rib, and a circuit board insertable within said housing, said contact arrangement comprising a bus portion having at one end a first resilient leg for engagement with one terminal of a battery seated within the recess and at another end a second leg having a knife-edge in contact with a circuit path on said circuit board, said circuit board being disposed between said legs such that said second leg engages said circuit path on a side of said circuit board opposite said first leg and presses against said circuit board in a direction parallel to and opposite the direction in which said first leg presses against said one battery terminal, and urges said circuit board into supportive engagement with said first support rib of said housing.

2. Apparatus according to claim 1, wherein said housing includes front and rear walls and a pair of side walls, second ribs disposed on one of said side walls adjacent an end of said circuit board opposite said first rib, said circuit board disposed in a plane between said first and second ribs and parallel to said side walls.

3. Apparatus according to claim 2, wherein said instrument is a clock.

4. Apparatus according to claidm 1, wherein said housing includes front and rear walls and a pair of side walls, said circuit board disposed parallel to said side walls.

5. Apparatus according to claim 4, wherein said circuit board is situated adjacent another terminal of the battery for direct contact therewith, such that said second leg presses said circuit board against said other battery terminal.

6. Apparatus according to claim 4, wherein said legs are joined to said bus portion of said contact arrangement by curved portions which bear against said side walls.

7. Apparatus according to claim 5, wherein said other battery terminal bears against a contact plate portion fastened to said circuit board, said housing including second support ribs situated adjacent a side of said contact plate opposite said other battery terminal.

8. Apparatus according to claim 7, wherein said contact plate includes a groove which receives said other battery terminal, said groove being open at one end and inclined therefrom.

9. Apparatus according to claim 7, wherein said contact plate is fastened to said circuit board by legs on said contact plate which pass through said circuit board.

* * * * *